United States Patent [19]

Acket et al.

[11] 4,359,776
[45] Nov. 16, 1982

[54] DEVICE FOR GENERATING OR AMPLIFYING COHERENT ELECTROMAGNETIC RADIATION, AND METHOD OF MANUFACTURING THE DEVICE

[75] Inventors: Gerard A. Acket; Peter J. de Waard; Giok D. Khoe; Gijsbrecht C. Wirtz, all of Eindhoven, Netherlands; Tullio E. Rozzi, Wirrat, England

[73] Assignee: U.S. Philips Corporation, New York, N.Y.

[21] Appl. No.: 49,778

[22] Filed: Jun. 18, 1979

[30] Foreign Application Priority Data

Nov. 8, 1978 [NL] Netherlands .................. 7811085
Jan. 29, 1979 [NL] Netherlands .................. 7900668

[51] Int. Cl.$^3$ .................................. H01S 3/19
[52] U.S. Cl. .................................. 372/46; 330/4.3; 357/17
[58] Field of Search ............ 331/94.5 H; 330/4.3; 372/46, 19, 32; 357/17

[56] References Cited

U.S. PATENT DOCUMENTS 4,251,780  2/1981  Scifres et al. .................. 331/94.5 H

OTHER PUBLICATIONS

Hakki, "Carrier and Gain Spatial Profiles in GaAs Stripe Geometry Lasers", *J. Appl. Phys.* vol. 44, pp. 5021–5028, Nov. 1973.

Primary Examiner—James W. Davie
Attorney, Agent, or Firm—Thomas A. Briody; Robert T. Mayer; Steven R. Biren

[57] ABSTRACT

A semiconductor laser/amplifier is disclosed in which the radiation oscillates only in one longitudinal mode. According to the invention this is achieved by a strip-shaped active region which exhibits periodic variations in amplification (and preferably also in the amplification profile) in its longitudinal direction over at least a part of its length. The period of the amplification variation is at least ten times the wavelength of the radiation.

12 Claims, 11 Drawing Figures

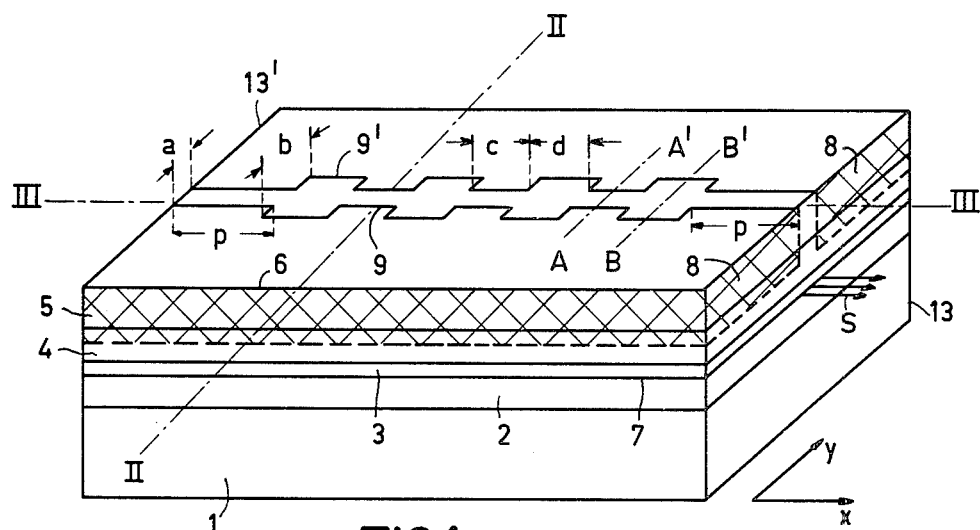
FIG.1
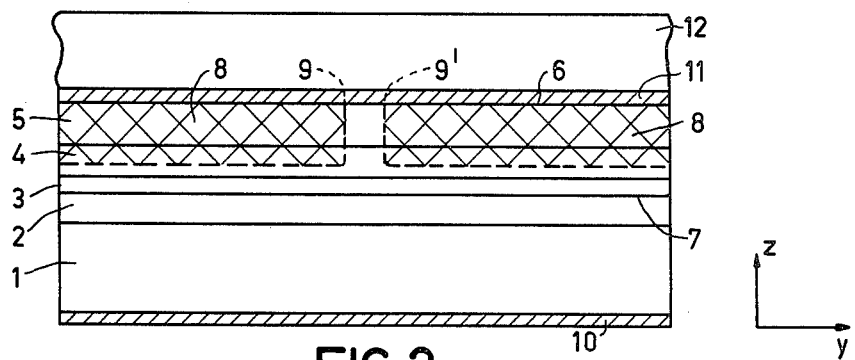
FIG.2
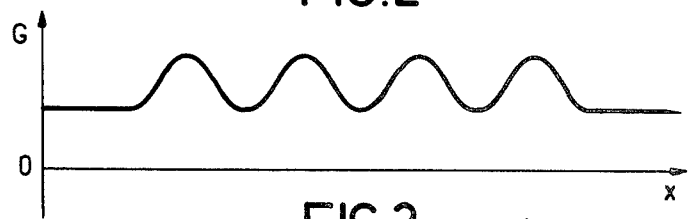
FIG.3
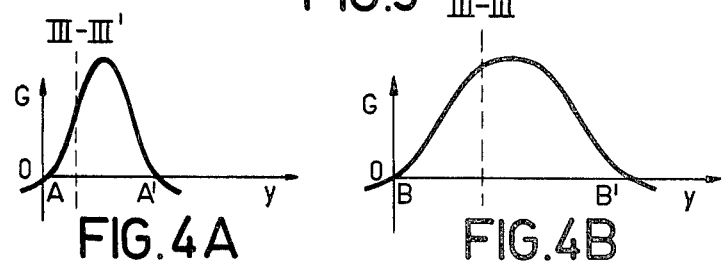
FIG.4A    FIG.4B

DEVICE FOR GENERATING OR AMPLIFYING COHERENT ELECTROMAGNETIC RADIATION, AND METHOD OF MANUFACTURING THE DEVICE

BACKGROUND OF THE INVENTION

The invention relates to a semiconductor device for generating or amplifying coherent electromagnetic radiation, having a semiconductor body comprising a strip-shaped active region having a p-n junction extending substantially parallel to a surface, and contact members situated on either side of said p-n junction to supply current to the p-n junction, one of the contact members comprising an electrode layer which is situated above the active region on the surface and which within a strip-shaped contact region forms a current supply contact with a readily conductive part of the semiconductor surface.

The invention also relates to a method of manufacturing the device.

Devices of the kind described are generally used in the form of semiconductor lasers, in which case the active region is located within a resonator generally formed by two parallel cleavage planes of the semiconductor crystal.

However, the device may also serve as a selective amplifier of coherent radiation, in which case no reflection members are used.

A semiconductor device of the kind as described, in the present case a laser, is known, for example, from "Philips Technical Review", Vol. 36, No. 7, 1976, pages 190-200.

Semiconductor lasers having a strip-shaped active region generally have the property that the electromagnetic waves amplified in the active region can oscillate in various modes. With respect to wave components propagating in the longitudinal direction of the strip-shaped active region, these modes are termed longitudinal modes, while wave components having a direction of propagation in the direction of thickness are termed transversal modes, and wave components propagating in the direction of width of the strip-shaped region are termed lateral modes.

For many applications, in particular for communication purposes, it is desired that the number of possible modes should be minimized so that preferably the laser amplification is sufficient to maintain oscillation for only one mode.

For the transversal and lateral modes a number of measures have already been proposed to achieve this. For the transversal modes this may be done, for example, by a suitable choice of the thickness of the active region and of the variation of the index of refraction in the direction of thickness in and near the active region. For the lateral modes a restriction to one mode can also be realized by a suitable choice of the variation of the index of refraction in the direction of the width of the active region. Reference is made in this connection, for example, to H. Kressel and J. K. Butler, "Semiconductor Lasers and Heterojunction LED's", New York 1977, chapter 7.

So far no satisfactory solution has been found to restrict the number of longitudinal modes. Since the length of the strip-shaped region within which the radiation amplification occurs amounts to a very large number of wavelengths, the number of possible modes in the Fabry-Perot resonant cavity between the reflection members is also very large.

In laser structures in which the reflection members are formed by providing a spatially periodic change of the index of refraction and/or the thickness on or near the active region, taken in the longitudinal direction of said region, the so-called DFB ("distributed feedback") structure as described, for example, in "Applied Physics Letters", Vol. 15, February 1971, pp. 152-154, it has indeed been possible to restrict the number of longitudinal modes considerably, but, due to the very small period of the variation of the index of refraction which is in the order of 1 wavelength, these structures are very difficult to realize technologically.

SUMMARY OF THE INVENTION

It is an object of the invention to provide a semiconductor laser or semiconductor amplifier in which the number of longitudinal modes can be restricted considerably and even be reduced to one, in which said frequency-selective behavior is substantially independent of the current, while technologically the structure can be manufactured in a reproducible and comparatively simple manner.

The invention is inter alia based on the recognition of the fact that this can be achieved by using a periodic structure having a period which is considerably larger than one wavelength of the emitted or amplified radiation.

According to the invention, a semiconductor device of the kind described above is characterized in that the active region within which amplification of the radiation takes place comprises, along a cross-section in its longitudinal direction, over at least a part of its total length a region having a spatially periodic variation in amplification in the wavelength range of the said radiation, the period of the amplification variation being at least ten times the wavelength of the emitted or amplified radiation within the semiconductor material.

Since the period of the amplification variation according to the invention is at least 10 wavelengths, in many cases more than 100 wavelengths, a structure in which this is the case can be realized in a much simpler and more reproducible manner than, for example, the period structures used in the said DFB-lasers.

With respect to the terms "periodical" and "period" it is to be noted that small deviations from a perfect periodicity occur inter alia due to technological problems. Measurements have demonstrated, however, that a deviation up to 10% from the true periodicity has substantially no adverse influence on the operation of the device according to the invention. When the term "periodical" is used in this application this is therefore to be understood to include a possible deviation up to 10% from the true periodicity.

The choice of the period distance of the amplification variations, of the ratio between the maximum and minimum values of the amplification, and of the number of periods to obtain the desired reduction (preferably to one) of the longitudinal modes depends on various circumstances and is based inter alia on the following considerations.

The difference $\Delta\lambda$ between the wavelengths of the successive possible longitudinal modes must preferably be at least so large that only one mode is sufficiently amplified, while the wavelengths of the most adjacent modes according to the curve indicating the variation of the amplification as a function of the wavelength for the laser in question lie in places where said amplification is insufficient to maintain the oscillation according to this mode. For this difference it holds that $$\Delta\lambda = (\lambda^2/2n'L)$$

wherein n' is the effective refractive index, $\lambda$ is the wavelength of the emitted radiation in the active region, and L is the period, that is to say the distance between two successive points where reflection of the relevant radiation occurs. Then $n' = n(1 - \lambda/n \cdot dn/d\lambda)$, where n is the refractive index of the semiconductor material.

In known strip contact lasers in which the amplification is substantially constant throughout the active region, the distance L is equal to the distance between the mirror faces, usually the end faces of the crystal. This distance is a few hundred $\lambda$m. From this follows for $\Delta\lambda$ a value of a few tenths of nm for conventional lasers. It will be obvious that with a period of, for example, a few tens of $\mu$m the distance $\Delta\lambda$ between wavelengths of adjacent modes will increase to, for example, a few nm, so that via the variation of the amplification in accordance with the wavelength the number of modes for which the amplification is sufficient to maintain the oscillation can be considerably reduced and even be reduced to one.

Therefore, according to a preferred embodiment, the period distance of the amplification variations is at most equal to one fifth of the length of the active region.

However, the distance $\Delta\lambda$ between successive modes should not be too large either, or else the possibility might exist that not one mode can be found the wavelength of which lies within the wavelength range for which sufficient amplification occurs to maintain the radiation. The amplification profile generally shows a maximum value for a certain (free-space) wavelength $\lambda_o$. Within the full width half maximum (fwhm) of the amplification profile, that is to say over the wavelength range between the wavelengths for which the amplification is half of the maximum amplification, the amplification is sufficient to maintain the radiation. Therefore a further preferred embodiment is characterized in that the distance $\alpha\lambda$ between successive modes is at most equal to the said full width half maximum $\Lambda$, which means in connection with the above that the period distance of the amplification variation is at least equal to $(\lambda_o^2/2n'\Lambda)$.

Dependent inter alia on the reflection at the junction between zones having different amplifications in the region of the periodic amplification variation, the combination of the number of amplification variations and the period distance thereof can be determined experimentally by those skilled in the art. Generally, in the region with periodic amplification variation with a larger number of periods, a smaller variation in the amplification will suffice, and vice versa.

According to the invention the amplification variations can be realized in various manners. According to a first preferred embodiment the periodic amplification variations are obtained by a periodic variation in the width of the strip-shaped active region, over at least a part of the length of this region. In the simplest case, parts of constant and mutually equal larger widths are alternated by parts of likewise constant and mutually equal smaller widths. Such a structure can be manufactured by means of a very simple mask. The transition between the wider and narrower parts, however, may also be less abrupt; for example, the edges of the strip-shaped active region may be formed by undulating lines or by zig-zagging lines.

Such a variable width of a part of the active region can advantageously be realized by giving a part of the contact region between one electrode and the semiconductor surface a variable width, for example by using a strip-shaped electrode layer of variable width, or a strip-shaped aperture of variable width in an insulating layer present on the semiconductor surface, within which aperture an electrode layer contacts the semiconductor surface. According to another method, in which the active region is bounded laterally by a semiconductor region which forms a p-n junction with the active region or which has a very high resistivity obtained, for example, by proton bombardment, the boundary between said semiconductor region and the active region may determine the desired width variation.

According to quite a different preferred embodiment, the periodic amplification variations are realized by semiconductor zones which, in the longitudinal direction of the active region, are located at regular distances and show an electric conductivity differing from that of the adjoining semiconductor material. Said zones preferably extend from the strip-shaped contact region to the vicinity of the active region. They may be obtained, for example, by proton bombardment, but they may also be obtained differently, for example, by contour epitaxy. However, they need certainly not extend up to the semiconductor surface. They should be provided so that the current distribution caused thereby causes a maximum current density in those places which must show a maximum amplification, as described hereinbefore.

A very suitable method of manufacturing the last-mentioned device is characterized according to the invention in that island-shaped metal layer portions are provided on the surface of a semiconductor plate with an active laser layer at regular distances in the longitudinal direction of the strip-shaped active region to be formed, and that the said surface is then subjected to a proton bombardment in which the said metal layer portions mask against said bombardment, the energy level being chosen so that the protons penetrate down to a small distance from the active layer, electrodes being then provided on the lower and upper surfaces of the semiconductor plate.

BRIEF DESCRIPTION OF THE DRAWING

The invention will now be described in greater detail with reference to various embodiments and the drawing, in which:

FIG. 1 is a diagrammatic partially perspective view of a semiconductor device according to the invention, FIG. 2 is a diagrammatic cross-sectional view taken on the line II—II of FIG. 1, FIG. 3 shows diagrammatically the variation of the amplification G over the cross-section III—III of the active region.

FIGS. 4A and B show amplification profiles in the cross-sectional views taken on the lines AA' and BB' of the active region.

All the figures are diagrammatic and not drawn to scale for clarity. Corresponding parts are generally referred to by the same reference numerals.

DETAILED DESCRIPTION

Figure 5:
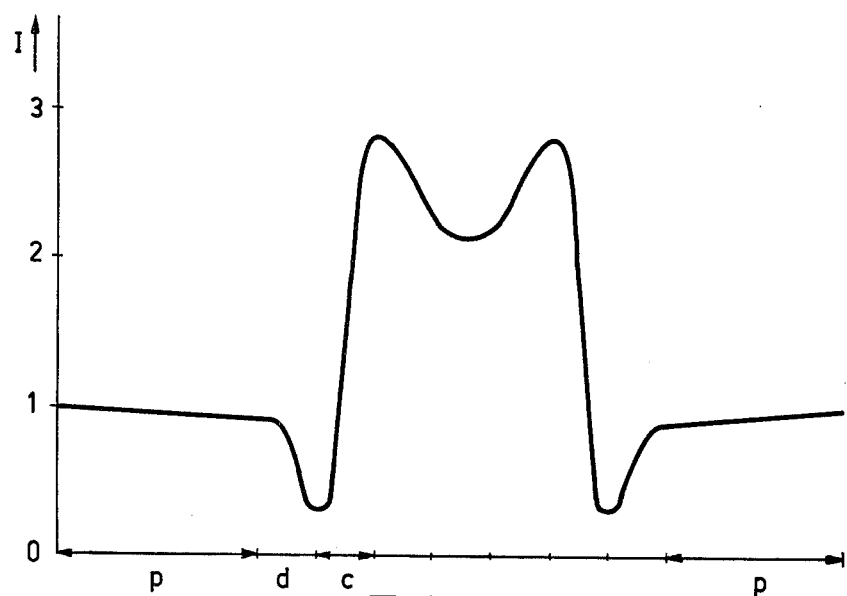
FIG. 5 shows the relative intensity variation of the radiation in the longitudinal direction of the active region.

FIG. 1 is a partially perspective view and FIG. 2 is a cross-sectional view taken on the line II—II of FIG. 1 of a semiconductor device according to the invention. In this example the device is a semiconductor laser the layer structure of which is of a known construction. An epitaxial layer 2 of n-type gallium aluminum arsenide ($Al_xGa_{1-x}As$) having approximately 30 at. % aluminum (x=0.3), a doping concentration of approximately $3.10^{17}$ tin atoms/cm$^3$ and a thickness of approximately 2 μm is grown on a monocrystalline substrate 1 (orientation (001)) of n-type gallium arsenide GaAs having a doping concentration of approximately $10^{18}$ atoms/cm$^3$ and a thickness of approximately 80 μm. An approximately 0.3 μm thick active layer 3 of p-type GaAs is present thereon and a layer 4 of $Al_xGa_{1-x}As$ is again present thereon having the same atomic percentage of aluminum as the layer 2, now, however, with a p-type doping of approximately $5.10^{17}$ germanium atoms/cm$^3$. Hereon is present finally a p-type contact layer 5 of GaAs in a thickness of approximately 1.5 μm and a doping concentration of approximately $10^{18}$ germanium atoms/cm$^3$. The interfaces between the layers are shown in solid lines. The layers 2 and 3 together form a p-n junction 7 extending substantially parallel to the surface 6.

Furthermore, regions 8 are present in the semiconductor body and have a very high resistivity, extend on the surface 6 down to approximately halfway the layer 4 and have been obtained by means of a proton bombardment. The regions 8 are bounded laterally by the side faces of the semiconductor body and by substantially vertical boundary faces intersecting the surface 6 according to the lines 9 and 9'.

Contact members in the form of electrode layers 10 and 11 are present on either side of the p-n junction 7 on the upper and lower surfaces (see FIG. 2), which layers are not shown in FIG. 1 for reasons of clarity. A cooling member 12, preferably of a material which is both a good electrical and thermal conductor (copper) is in contact with the metal layer 11. By applying a voltage in the forward direction at the contact members 10 and 11 across the p-n junction 7, a current may be applied to said junction. The metal layer 11 within the strip-shaped contact region which is situated between the lines 9 and 9' forms a current supply contact with a readily conducting part of the semiconductor surface 6. As a result of this, a strip-shaped active region is formed in the active layer 3 whose boundaries are determined to an approximation by the perpendicular projection of the lines 9 and 9' on the layer 3.

Said strip-shaped active region is situated between a resonant cavity formed by the side faces 13 and 13' extending perpendicularly to the longitudinal direction of the active region. These are (110) cleavage planes of the crystal which, due to the large difference in index of refraction on either side of the cleavage plane, reflect sufficient radiation to maintain coherent laser radiation with current densities above a certain limit value, which radiation emanates in the direction of the arrows S at the face 13. It is to be noted that the active region in this application is to be understood to mean the region within which in the operating condition the amplification of the radiation in the active layer is positive.

In known lasers having the above-described semiconductor sructure the lines 9 and 9' are straight mutually parallel lines which determine a strip-shaped contact region and a strip-shaped active region of uniform width. Within such an active region the amplification of the emitted radiation is substantially constant along a longitudinal cross-section through the active region while the amplification profile measured across a cross-section of the active region is also substantially equal everywhere. These known lasers can often oscillate in several modes.

According to the invention, however, the active region within which amplification of the radiation takes place comprises along a cross-section in its longitudinal direction over at least a part of its total length a region having a spatially periodic amplification variation in the wavelength range of the said radiation, in which the period of said amplification variation is at least ten times the wavelength of the emitted radiation within the semiconductor material. See FIG. 3 in which the variation of the amplification G is shown diagrammatically along a longitudinal cross-section beside the center of the region bounded by the lines 9 and 9'. The period distance of the amplification variation is 40 μm, which is more than 160 times the wavelength of the amplified radiation within the semiconductor material which is approximately 250 nm. In the embodiment of this example the periodic amplification variation is obtained by a periodic variation in the width of the strip-shaped active region bounded substantially by the projection of the lines 9 and 9', over a part of said region.

The distances a, b, c, d and p (see FIG. 1) are successively 5 μm, 15 μm, 20 μm 20 μm and 70 μm. The number of periods is four; the period distance of 40 μm is less than one fifth of the length (280 μm) of the active region.

It is furthermore to be noted that in this embodiment of the device according to the invention a periodic variation of the amplification occurs not only in the longitudinal direction of the active region but a periodic variation of the amplification profile also occurs over the width of the active region. This is shown diagrammatically in FIG. 4. FIG. 4A shows the variation of the amplification profile in a cross-section over the width of the active region taken on the lines AA' of FIG. 1, and FIG. 4B shows the variation of the amplification profile over the cross-section BB'. It is to be noted that the amplification G is not plotted quantitatively in FIGS. 3 and 4 but only to denote the nature of the amplification variation, in which it is expressed in FIG. 4 that the amplification value, in the said longitudinal section III-–III' located beside the center is higher in the cross-section BB' than in the cross-section AA'.

It has been found that the above-described laser oscillates only in one longitudinal mode, which is to be ascribed to the filtering action of the period structure. The distance between modes of successive order, with the dimensions chosen in this case, is approximately 2 nm, which, in view of the dependence of the amplification factor G on the wavelength, is sufficient to obtain amplification for only one mode of oscillation to maintain the oscillation.

In this example the wavelength $\lambda_o$ for which the amplification is maximum is approximately 870 nm; the effective index of refraction $n' = n(1-\lambda/n\, dn/d\lambda)$ for the same wavelength is approximately 5.1 and the difference $\Lambda$ between the two wavelengths for which the amplification is half of that for the wavelength $\lambda_o$ is 12 nm. Since the period distance (40 μm) is larger than $(\lambda 2_o/2n'\lambda)$, no two successive modes can both be sufficiently amplified to maintain laser oscillations.

Since the ratio of the minimum and maximum width of the active region in the part with periodic amplification variation is sufficiently large, the reflection of the junctions between the wider and narrower parts is sufficiently large so that four periods will suffice. The said ratio is preferably chosen to be at least equal to 1.5 and at most equal to 5. With a smaller ratio than 1.5, the reflection at the junctions between the wider and narrower parts is so small that a large number of periods is necessary. With a ratio exceeding 5 the surface of the wider parts of the active region becomes so large that the overall required current strength and the associated losses may become unacceptably large.

The variation of the relative intensity I of the radiation in the active region according to the longitudinal direction of said region has been calculated for the above case and is shown in FIG. 5. From this appears an important further advantage of the device according to the invention, namely that the maximum intensity of the radiation near the ends of the periodic structure is considerably higher than near the mirrors or cleavage planes which are situated at the ends of the laser. When the current strength is increased, the intensity is saturated at the area of the maxima, at a value of approximately $10^7$ Watts per cm². Saturation also occurs (at a much lower value than at the maxima) at the mirror surfaces, so that the danger of damage of these mirror surfaces is much smaller than in conventional lasers in which the maximum intensity occurs at the mirror surfaces.

The device described can be manufactured entirely according to conventional methods. The successive epitaxial growth of semiconductor layers of various compositions is generally known in the technology of the heterojunction lasers and is described in detail in other places in the technical literature. Reference is made, by way of example, to the book by D. Elwell and H. J. Scheel, Crystal Growth from High Temperature Solutions, Academic Press 1975, pp. 433-467. Therefore the manufacture of the layer structure need not be described in detail. The proton bombardment to form the substantially insulating regions 8 may be carried out by means of a suitable masking of, for example, gold at an energy of, for example, approximately 300 KeV and a dose of approximately $10^{15}$ protons/cm²; the annealing of said implantation is carried out a approximately 500° C. for a few minutes during the alloying of the electrode layers.

The region of variable amplification may extend throughout the length of the active region; generally, however, it desirable not to make the number of periods larger than is necessary to prevent undesired current losses.

As already said, in the laser described the active region is bounded laterally by a semiconductor region 8 which restricts the current to the active region and hence shows a boundary face determining the said width variations. In the case described this is a high-ohmic region obtained by proton bombardment. In the embodiment described it is also possible, however, to use a region 8 which is n-type conductive and forms a p-n junction with the adjoining p-type semiconductor material; said p-n junction restricting the current to the active region.

Figure 6:
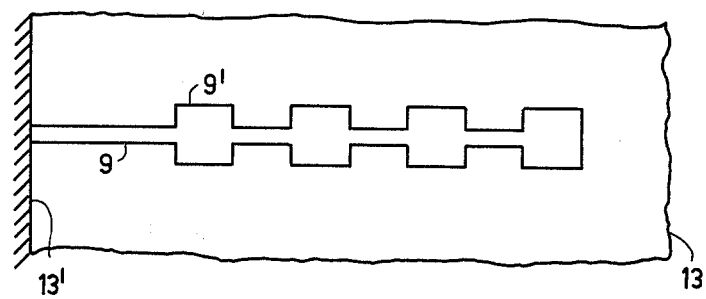
FIGS. 6 and 7 are plan views of modified embodiments of the device shown in FIGS. 1 and 2.

The reflection at the discontinuities between the active region parts of larger and smaller width in the embodiment described is so large that one mirror surface at the end of the laser structure will suffice; the function of the other mirror surface is then taken over by the feedback coupling caused by the periodic structure. This case is shown in the diagrammatic plan view of FIG. 6. The side face 13' is a cleavage plane as in the preceding example; the side face 13 need not be reflecting in this case.

Figure 7:
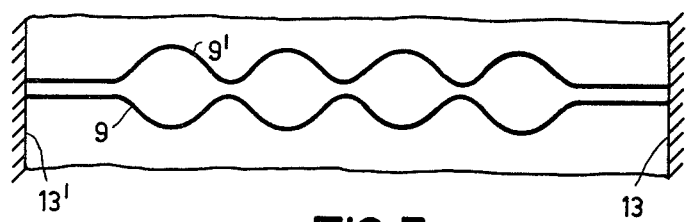

The shape of the periodic structure may also be less discontinuous, for example, as shown in FIG. 7. Nor need the length of the narrower parts of the active region be equal to that of the wider parts.

Figure 8:
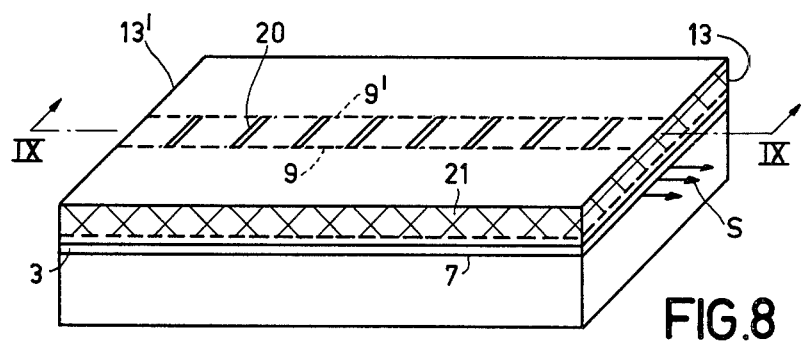
FIG. 8 is a diagrammatic partially perspective view of another embodiment of the device in accordance with the invention.
Figure 9:
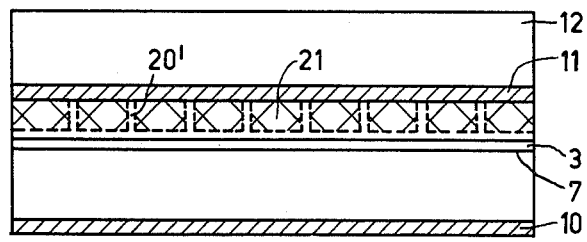
FIG. 9 is a diagrammatic cross-sectional view taken on the line IX—IX of FIG. 8.

FIG. 8 is a diagrammatic partially perspective view and FIG. 9 is a diagrammatic cross-sectional view taken on the line IX—IX in FIG. 8 of a quite different embodiment of a device according to the invention. In this case also the device comprises a semiconductor body having an active layer 3 in which stimulated radiation amplification can occur when a current is supplied in the forward direction to the p-n junction 7 by applying a voltage across the electrode layers 10 and 11, the electrode layer 11 being in contact with a cooling member 12. The electrode layers 10 and 11, as well as the cooling member 12, are not shown in FIG. 8 for reasons of clarity.

The active region bounded by the imaginary lines 9 and 9' shown in broken lines in FIG. 8 is determined by a number of rectangular regions 20 the longitudinal direction of which extends parallel to the reflecting cleavage planes 13 and 13' and the length of which is 5 μm, the width is 3 μm and the periodic distance is 20 μm. These are the regions in which the current density is largest and in which consequently the largest amplification occurs in the active layer 3. In fact, a surface-adjacent region 21 of very high resistivity has been formed by means of a proton bombardment, which region extends from the upper surface down to a distance of approximately 1 μm from the active region 3 as is shown in FIGS. 8 and 9 by means of the crossed shading. The regions 20 were masked during the proton bombardment so that the semiconductor region extending vertically therebelow has remained readily conductive. Since the region 21 does not extend entirely down to the active layer 3, the amplification in this layer is not adversely influenced by increased recombination as a result of the lattice distortion produced by the proton bombardment, while in addition the current flowing via the readily conductive semiconductor regions 20' situated below the regions 20 can slightly spread above the active layer 3 so that the parts of the active layer situated between the regions 20 below the region 21 still receive sufficient current so as not to become absorbing for the radiation to be amplified. In principle the embodiment of FIGS. 8 and 9 shows the same advantages of oscillation in only one longitudinal oscillation mode as that of the preceding example, although the occurring amplification variations in this case will be smaller so that in general a larger number of periods will be necessary than in the preceding example. Whereas in the preceding example the desired result was obtained by a periodic variation not only of the amplification but of the whole amplification profile over the cross-section of the strip-shaped active region, the amplification in the device shown in FIGS. 8 and 9 is varied periodically by a periodic variation in the current density throughout the length of the active region. It should be ensured that the regions of maximum amplification, that is to say the regions at the area of the rectangles 20, are situated in locations where the amplified standing wave shows a bulge.

The device shown in FIGS. 8 and 9 can advantageously be manufactured as follows.

Figure 10:
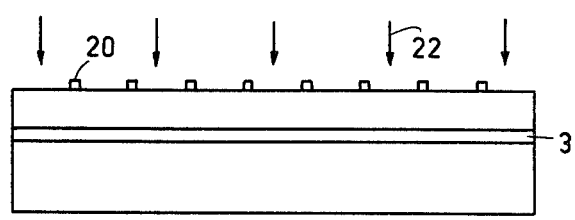
FIG. 10 is a corresponding diagrammatic cross-sectional view of the device shown in FIGS. 8 and 9 during a stage of manufacture.

Starting material is a semiconductor wafer 2 having an active layer 3 which shows a layer structure which, for example, is equal to that according to the embodiment shown in FIGS. 1 and 2 both in construction and in dimensions, except for the region 8. Provided on the upper surface of said layer structure is a metal layer having a composition and thickness suitable to mask against the subsequent proton bombardment. By using conventional photolithographic etching methods, a pattern is formed from said metal layer which consists only of the rectangular regions 20 (see FIG. 10); the metal is removed everywhere else. For this purpose, for example, a layer of photolacquer is provided on the metal which, after exposure and development, remains only in the location of the regions 20 on the metal, after which the metal not covered by the photolacquer is removed by etching. Alternatively, before providing the metal, a masking layer may be provided on the semiconductor surface in which, at the area of the regions 20, apertures are provided after which a metal layer is deposited on the masking layer and in the apertures. The masking layer (for example a silicon oxide layer) with the overlying metal is then removed, the metal remaining within the regions 20. These methods, or any other suitable method, may be used to provide the metal strips 20.

The upper surface is then bombarded (see FIG. 10) with protons (22), the energy and the dose being controlled so that the protons penetrate down to a depth which is still approximately 1 μm from the active layer 3 and in this manner form the desired region 21 of very high resistivity, for example $10^4$ Ohm.cm.

The electrodes 10 and 11 and the cooling member 12 may then be provided and the device may then be finished. The cleavage planes 13 and 13′ may be formed either before or after the proton bombardment.

In this embodiment also the period of the amplification variations is considerably larger than 10× the wavelength of the amplified radiation in the semiconductor material.

Both the semiconductor device shown in FIGS. 1 and 2 and that of FIGS. 8 and 9 may be used as a selective amplifier instead of as a laser. For that purpose the planes 13 and 13′ are provided with an anti-reflective layer. Incident radiation (for example from a glass fiber) enters, for example, via the plane 13 and emanates via the plane 13′; amplification occurs only for the narrow frequency range which is determined by the periodic structure in the active region.

The invention is not restricted to the embodiments described. For example, in the device shown in FIGS. 1 to 7 other forms for the width variations of the active region may be used than those which are indicated in the examples. The shape of the active region may also be determined by the shape of the electrode layer 11 which then is provided in a pattern bounded by the lines 9 and 9′ of FIGS. 1, 6 or 7. In this case, in certain circumstances the region 8 may also be omitted, if necessary. In the device shown in FIGS. 8 to 10 the regions 10 may also be provided in another form, while for the formation of the layer constructed from the regions 21 and 20′, other methods, for example selective epitaxial growth, may be used instead of a proton bombardment. Other semiconductor layer structures and other suitable semiconductor materials may also be used to be selected by those skilled in the art from the ample literature existing in this field. In the examples, all conductivity types may be replaced (at the same time) by the opposite conductivity type.

What is claimed is:

1. A semiconductor device for operation with coherent electromagnetic radiation, which comprises:
   a semiconductor body having a major surface;
   a strip-shaped active region having a p-n junction extending substantially parallel to said major surface;
   a contact member on each side of said p-n junction to supply current to said junction, one of said contact members comprising an electrode layer which is located on said major surface above said strip-shaped active region, said electrode layer forming a current supply contact with a conductive part of said major surface within a strip-shaped contact region above said active region; and
   means for providing a spatially periodic amplification variation in portions of said active region in the wavelength range of said radiation over at least a part of its total length in the longitudinal direction, the period of said amplification variation being at least ten times the wavelength of said radiation within the semiconductor material and at most equal to one-fifth of the length of said active region, said portions of the active region having a common center line in the longitudinal direction.

2. A semiconductor device as claimed in claim 1, characterized in that said active region is situated within a resonant cavity.

3. A semiconductor device as claimed in claim 3, characterized in that the period of the amplification variations is at least equal to $(\lambda^2_o/2n'\Lambda)$, where $\lambda_o$ is the free space wavelength for which the amplification is maximum, $n'$ is the effective index of refraction and $\Lambda$ is the difference between the two wavelengths for which the amplification is half of that for the wavelength $\lambda_o$.

4. A semiconductor device as claimed in claim 1, characterized in that the periodic amplification variation is obtained by a periodic variation in the width of the strip-shaped active region over at least a part of the length of said region.

5. A semiconductor device as claimed in claim 4, characterized in that in the region of varying width, parts of constant and mutually equal smaller width are alternated by parts of likewise constant and mutually equal larger width.

6. A semiconductor device as claimed in claim 4 or 5, characterized in that the ratio of the maximum value to the minimum value of the width is at least 1.5 and at most 5.

7. A semiconductor device as claimed in claim 4 or 5, characterized in that the active region is bounded laterally by a semiconductor region which restricts the current to the active region and which forms a boundary surface with said active region which determines said width variations.

8. A semiconductor device as claimed in claim 1 or 2, characterized in that the periodic amplification variations are obtained by a plurality of semiconductor zones located at regular distances in the longitudinal direction of the active region and having an electrical conductivity differing from that of the adjoining semiconductor material.

9. A semiconductor device as claimed in claim 8, characterized in that said zones are conductive and are surrounded by high-resistivity semiconductor material.

10. A semiconductor device as claimed in claim 9, characterized in that the high-resistivity semiconductor material is a semiconductor layer obtained by proton bombardment.

11. A semiconductor device as claimed in claim 9, characterized in that island-shaped metal layer portions are provided on the surface of said semiconductor body, said body comprising an active laser layer, said metal layer portions being provided at regular distances in the longitudinal direction of the strip-shaped active region to be formed, and the surface is then subjected to a proton bombardment in which said metal layer portions mask against the bombardment, the energy level being chosen such that the protons penetrate down to a small distance from the active layer, electrodes then being provided on the upper and lower surfaces of the semiconductor body.

12. A semiconductor device as claimed in claim 4, characterized in that said strip-shaped active region extends between first and second side faces of the body, said first side face being a mirror face substantially perpendicular to the longitudinal direction of the active region and said second side face being a substantially nonreflecting face.

* * * * *